(12) United States Patent
Min et al.

(10) Patent No.: US 10,485,399 B2
(45) Date of Patent: *Nov. 26, 2019

(54) DISH WASHER

(71) Applicant: LG ELECTRONICS INC., Seoul (KR)

(72) Inventors: Hyeseong Min, Seoul (KR); Taewon Son, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/050,606

(22) Filed: Jul. 31, 2018

(65) Prior Publication Data

US 2018/0333038 A1  Nov. 22, 2018

Related U.S. Application Data

(63) Continuation of application No. 15/377,687, filed on Dec. 13, 2016, now Pat. No. 10,064,538.

(30) Foreign Application Priority Data

Jan. 6, 2016  (KR) .......................... 10-2016-0001761

(51) Int. Cl.
  *A47L 15/42* (2006.01)
  *A47L 15/00* (2006.01)
  (Continued)

(52) U.S. Cl.
  CPC ....... *A47L 15/4293* (2013.01); *A47L 15/0034* (2013.01); *A47L 15/4257* (2013.01);
  (Continued)

(58) Field of Classification Search
  CPC .............. A47L 15/0034; A47L 15/488; A47L 15/4257; A47L 15/4293; H03K 17/9643
  (Continued)

(56) References Cited

U.S. PATENT DOCUMENTS 6,893,061 B2 * 5/2005 Miller ................. A47L 15/4259
  292/121
8,347,902 B2  1/2013 Baldwin
  (Continued)

FOREIGN PATENT DOCUMENTS

CN  102188217 A  9/2011
CN  103046291 A  4/2013
  (Continued)

OTHER PUBLICATIONS

Anonymous: "LG Electronics Model LDF7774BD", (Oct. 31, 2015), XP055344997, Retrieved from the Internet: URL:http://web.archive.org/web/20151031114149/http://www.homedepot.com/p/LG-Electronics-Top-Control-Dishwasher-with-3rd-Rack-in-Black-Stainless-with-Stainless-Steel-Tub-LDF7774BD/206637132, 3 pages.
  (Continued)

*Primary Examiner* — James O Hansen
(74) *Attorney, Agent, or Firm* — Dentons US LLP

(57) ABSTRACT

A dish washer according to an embodiment of the present invention includes a cabinet which forms a dish washing space; a door which opens and closes an opened front surface of the cabinet; wherein door includes an out plate which is made of metal plate material and forms the front surface of the door and at least a portion of appearance of a peripheral surface of the door by being bent the front surface, an operating unit which is formed on the peripheral surface of the door so that a user operates by touch, a PCB assembly which is in close contact with a rear surface of the operating unit and on which a plurality of touch sensors detecting displacement of the operating unit are mounted, a mounting bracket which is mounted to be fixed to an inside surface of the out plate, and an elastic member which is mounted on the mounting bracket and presses and supports the PCB assembly to the a rear surface of the operating unit.

20 Claims, 9 Drawing Sheets

(51) Int. Cl.
*A47L 15/48* (2006.01)
*H03K 17/96* (2006.01)

(52) U.S. Cl.
CPC ........ *A47L 15/488* (2013.01); *H03K 17/9643* (2013.01); *A47L 15/4259* (2013.01); *A47L 2301/08* (2013.01); *A47L 2401/20* (2013.01); *A47L 2501/22* (2013.01); *A47L 2501/26* (2013.01)

(58) Field of Classification Search
USPC .................................................. 312/228, 311
See application file for complete search history.

(56) References Cited

U.S. PATENT DOCUMENTS

| | | |
|---|---|---|
| 9,220,394 B2 | 12/2015 | Heater et al. |
| 2004/0163684 A1 | 8/2004 | Hapke |
| 2010/0051072 A1 | 3/2010 | Brambilla |
| 2011/0175845 A1 | 7/2011 | Honda et al. |
| 2011/0181516 A1 | 7/2011 | Mallory et al. |
| 2011/0215688 A1 | 9/2011 | Jang |
| 2013/0091904 A1 | 4/2013 | Kim et al. |
| 2013/0125937 A1 | 5/2013 | Baldwin et al. |
| 2013/0228202 A1 | 9/2013 | Welch et al. |
| 2013/0234574 A1* | 9/2013 | Fischer ............... A47L 15/4257 312/228 |
| 2014/0176159 A1 | 6/2014 | Pintiliuc et al. |
| 2014/0373455 A1 | 12/2014 | Haft |

FOREIGN PATENT DOCUMENTS

| | | |
|---|---|---|
| CN | 104024513 B | 9/2014 |
| DE | 102006024739 A1 | 11/2007 |
| DE | 102008043457 A1 | 6/2009 |
| DE | 102008052816 A1 | 4/2010 |
| EP | 3037758 A1 | 6/2016 |
| JP | 2006-250485 A | 9/2006 |
| JP | 2014-031978 A | 2/2014 |
| KR | 10-2006-0095805 A | 9/2006 |
| KR | 10-2007-0078276 A | 7/2007 |
| KR | 10-2011-0100383 A | 9/2011 |

OTHER PUBLICATIONS

Anonymous: "Owner's Manual Dishwasher LDT9965BD LDF7774BD", (Sep. 9, 2015), XP055345337, Internet Article, Retrieved from the Internet: URL:http://www.lg.com/us/support-product/lg-LDF7774BD, 68 pages.

\* cited by examiner

DISH WASHER

CROSS-REFERENCE TO RELATED APPLICATIONS

This application is a continuation application of U.S. application Ser. No. 15/377,687, filed on Dec. 13, 2016 (now allowed), and claims priority under 35 U.S.C. § 119 and 35 U.S.C. § 365 to Korean Application No. 10-2016-0001761, filed in Korea on Jan. 6, 2016, the entire disclosures of each are hereby incorporated by reference.

BACKGROUND

1. Field

The present invention relates to a dish washer.

2. Background

Generally, a dish washer is a device that removes food, dirt or the like remaining on the used dishes by chemical decomposition reactions and mechanical hydraulic pressure adjustment and has various functions such as a rinsing function, a disinfection function and a drying function in addition to a dish washing function. Therefore, the demand for the dish washer is growing trend.

A dish washer of which the various functions are simply operated and appearance is further improved and can be seen to be luxurious is being developed.

Typically, in the Korean Application No. 10-2007-0078276, a control panel is provided on a front surface of a door which shields a case of the dish washer and a structure in which is provided a button for pressing and operating by a user in the control panel is disclosed.

However, a structure for operating the door and displaying states of the dish washer is provided on the front surface thereof in this structure and thus there is a problem of the operation of the door being inconvenient because the height of the dish washer is generally low.

In addition, the appearance of the dish washer has a complicated shape by a number of buttons being exposed to the front surface of the door. Due to this, there is a problem of the entire appearance of the dish washer being degraded.

SUMMARY

An objective of an embodiment of the present invention is to provide a dish washer of which touch recognition rate is improved.

An objective of an embodiment of the present invention is to provide a dish washer of which a operating portion is provided on an upper surface of the door.

An objective of the embodiment of the present invention is to provide a dish washer of which appearance is made of metal material and which provides an operating unit capable of operating by touch on an edge portion of the door.

An objective of an embodiment of the present invention is to provide a dish washer which provides a stable supporting structure of a PCB for touch input.

An objective of an embodiment of the present invention is to provide a dish washer of which durability is improved in order to prevent damage and deformation due to an excessive touch operation.

A dish washer according to an embodiment of the present invention includes a cabinet which forms a dish washing space; a door which opens and closes an opened front surface of the cabinet. The door includes an out plate which is made of metal plate material and forms at least a portion of appearance of a peripheral surface of the door by being bent the front surface with the front surface of the door, an operating unit which is formed on the peripheral surface of the door so that the user operates by touch, a PCB assembly which is in close contact with a rear surface of the operating unit and on which a plurality of touch sensors detecting displacement of the operating unit are mounted, a mounting bracket which is mounted to be fixed to an inside surface of the out plate, and an elastic member which is mounted on the mounting bracket and presses and supports the PCB assembly to the a rear surface of the operating unit.

The operating unit is formed on an upper surface of the door.

A display unit on which operating information is displayed by a print or a surface treatment is formed on a surface of the operating unit corresponding to a position of each of the plurality of touch sensors.

The mounting bracket is mounted to be in contact with the front surface and the peripheral surface of the door.

The dish washer includes a bending portion which is bent in the inside direction of the door on the peripheral surface, and a screw hole which is formed so that a screw is passed through the bending portion. The screw is fastened to the mounting bracket inserted into the space formed by the front surface and the peripheral surface of the door and the bending portion and thus allows the mounting bracket to be fixed.

A elastic member mounting portion which is formed in a shape corresponding to the elastic member and in which the elastic member is accommodated is formed on the mounting bracket.

The elastic member mounting portion is formed by a mounting portion rib having a height which is less than the height of the elastic member.

A reinforcing rib which supports the elastic member mounting portion from a lower side by extending to another surface of the mounting bracket which is in contact with a lower surface of the elastic member mounting portion is formed on the lower surface of the elastic member mounting portion.

A plurality of reinforcing ribs are formed along the elastic member mounting portion and disposed to be parallel to each other with a fixed distance.

A height of the elastic member is formed to be greater than a distance between a bottom surface of the elastic member mounting portion and the PCB assembly.

The elastic member includes a rectangular shape of a support portion which is opened at the center thereof and which is disposed on a lower side corresponding to between the touch sensors with each other, and a connecting portion which connects between the support portions with each other.

A center of the connecting portion is formed to be opened.

The connecting portion is formed to be less than the height of the support portion.

A display mounting portion in which a display for displaying operating information of the dish washer is accommodated is formed in the mounting bracket, and a display unit which includes a set of a plurality of first fine through holes through which light emitted from the display is selectively transmitted is formed in the out plate corresponding to the display.

A depression portion in which the PCB assembly is accommodated by being formed in a shape corresponding to the PCB assembly is formed on the upper surface of the mounting bracket.

The depression portion includes the display mounting portion, and an elastic member mounting portion which accommodate the elastic member by being disposed on the both sides of the display mounting portion.

A indicator hole in which a front indicator displaying an operation of the dish washer is mounted is formed on the mounting bracket. A through hole through which light of the front indicator is transmitted is formed on the front surface of the door corresponding to the indicator hole.

An LED is formed on a side of each touch sensor in the PCB assembly. A second through hole is formed on a position corresponding to the LED in the operating unit. Light of the LED is transmitted through the second through hole and then is irradiated by the LED turning on according to whether or not the touch sensor detects.

A handle for an turning operation of the door is provided on the front surface of the door. A tilting module which includes a push rod is provided on the mounting bracket, the push rod being selectively projected to the rear surface of the door and pushing the cabinet to open the door, and both ends of the handle is mounted on the tilting module by passing through the out plate and the mounting assembly to work with the push rod.

the PCB assembly includes a sensor PCB which supports a periphery of the touch sensor by a sensor hole being formed in the position on which the touch sensor is mounted; a conductive foil which is provided on the front side of the sensor PCB and connects a common contacts between the touch sensor and the sensor PCB with each other; and a spacer which bonds the conductive foil and the sensor PCB while maintaining a fixed distance therebetween. A contacting portion which is projected to be in contact with the touch sensor is formed in the conductive foil.

According to a dish washer according to an embodiment of the present invention, there is an advantage of a general appearance being very simple and excellence by an appearance of a door of the dish washer being made of metal material and forming an operating unit which is capable of operating by touch on a peripheral surface, in particular, the upper surface.

In particular, the design is elegant by the configuration for operations which projects to the front surface of the door being removed and the appearance of the front surface is capable of improving even more by disposing an operating unit for operations on the peripheral surface thereof.

Ease of use may be improved by the operating portion being positioned on the upper surface of the door and thus a suitable height for operations being provided to the user.

The PCB assembly on which the touch sensor is mounted is in close contact with the rear surface of the operating portion and the state of being pressed by the elastic member is maintained and thus recognition rate of touch operation of the operating unit is capable of improving. In other words, the height of the elastic member is greater than a distance between the mounting bracket and the PCB assembly and a compressive force is always provided on the PCB assembly and thus a state where PCB assembly is in close contact with the rear surface of the operating unit is maintained.

In particular, the displacement when operating by touch does not greatly generate due to the structure thereof in the upper surface of the door of which the width is narrow and the edge is bent. However, the operation by touch of the user by being in close contact with the PCB assembly may be effectively recognized.

The elastic member includes a support portion which supports between the touch sensors and a connecting portion which connects the support portions with each other and the load transferred through the PCB may be distributed and thus prevents an excessive load form being transferred to the mounting bracket.

In addition, an opening is formed on the support portion and the connecting portion and thus the deformation of the elastic member is facilitated, and the load applied to the mounting bracket is even more distributed and thus damage of the mounting bracket is prevented.

The lower surface of the elastic member mounting portion is supported by a reinforcing rib and even if repetitive and continuous load is applied to the mounting bracket, a stable structure is maintained and thus durability can be improved.

In addition, the elastic member has a structure that the support portions are continuously connected by the connecting portion and the mounting portion rib is formed on the elastic member mounting portion and easy mounting of the elastic member is possible and thus it can be expected the effect of improving the productivity.

DETAILED DESCRIPTION

Hereinafter, a specific embodiment of the present invention will be described in detail with reference to the drawings. However, the present invention is not limited to the embodiment providing the spirit of the present invention. Another embodiment contained in the spirit range of the present invention or the other degenerating invention may be easily proposed by addition, change, deletion, or the like of another construction element.

Figure 1:
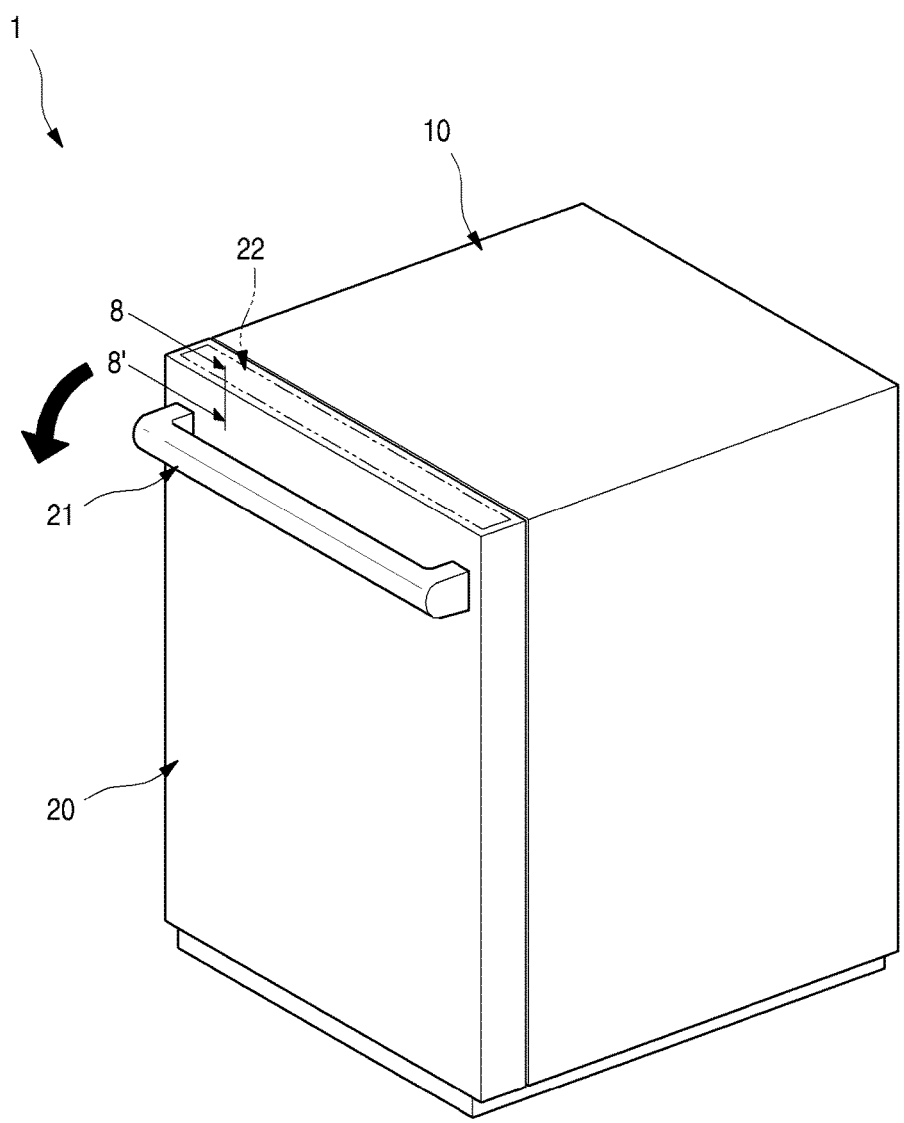
FIG. 1 is a perspective view illustrating a dish washer according to an embodiment of the present invention.

FIG. 1 is a perspective view illustrating a dish washer according to an embodiment of the present invention.

As illustrated in the drawing, a dish washer 1 according to an embodiment of the present invention may form appearance thereof by a cabinet 10 and a door 20.

A tub which provide a space for washing, and a sump which positions in the under portion of the tub and collects and stores a washing water in the tub are provided in an inside portion of the cabinet 10 and a pump and a flow path for flow of the washing water, and a nozzle for injecting the washing water, and the like may be provided in an inside portion of the cabinet 10 This inside structure of the cabinet 10 is a common structure and therefore the detailed description thereof is omitted.

The front surface of the cabinet 10 is opened and may be opened and closed by the door 20. A tub in the inside portion of the cabinet 10 may be exposed when opening the door 20 and thus dishes for washing can be accessible.

The door 20 is rotatably mounted on the front surface of the cabinet 10 and may be configured to open and close the opened front surface of the cabinet 10 by rotating relative to a lower end. A handle 21 is provided on the upper end of the front surface of the door 20 and the operation for opening of the door 20 is possible by grasping and pulling the handle 21. The handle 21 may be mounted by passing through the front surface of the door 20 and the opening of the door 20 may be facilitated by connecting with a tilting module 23 of the inside portion of the door 20.

An appearance of the cabinet 10 and the door 20 may be made of metal material in order to express the luxurious appearance. For example, the appearance of the door 20 and/or the cabinet 10 may be formed using a surface-treated stainless steel sheet.

An operating unit 22 which is operated for a driving operation of the dish washer 1 by a user and indicates an operation state of the dish washer 1 may be formed on the upper end of the door 20. The operating portion 22 may be formed on the peripheral surface of the door 20 and more specifically may be formed on the upper surface of the door 20 which is exposed to the outside. Accordingly, when the user stands in the front of the dish washer 1, the operating unit 22 may be disposed on a proper height and a position for an operation.

Figure 2:
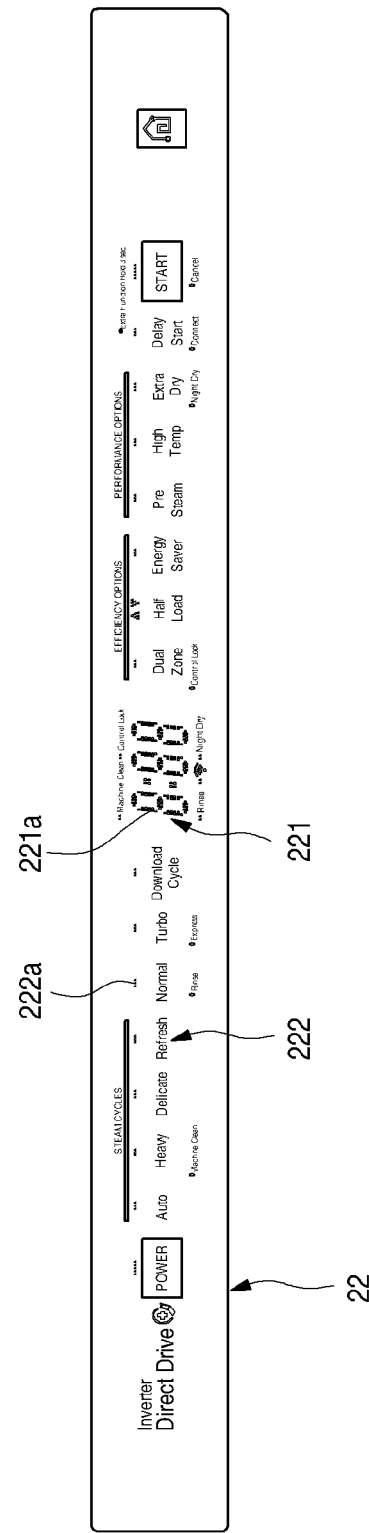
FIG. 2 is a plan view illustrating an operating unit of the dish washer.

FIG. 2 is a plan view illustrating the operating unit of the dish washer.

With reference to FIG. 2, describing the operating unit 22 in more detail, the operating unit 22 may be defined as most of a region of the upper surface of the door 20, a display unit 221 is formed in the center of the upper surface of the door 20 and a plurality of display units 222 may be formed on the both sides of the display units 221.

The display unit 221 is for displaying the state information of the dish washer 1 as numbers or letters, is formed as a plurality of first fine punching holes 221a and may be formed by being combined as at least one seven-segment shape. Information may be displayed by light emitted through the first punching holes 221a in the display unit 221 and the information is displayed in a shape of the numbers or letters according to the combination of the first punching holes 221a through which light is transmitted.

The display unit 222 is for facilitating the operation of the user and may be displayed in a shape of letter on the position corresponding to the plurality of touch sensors 62 to be described below, respectively. The display unit 222 may be formed by a surface machining such as printing or etching and it is possible to transfer information to functions which is expressed in the letters or characters and is operated. In particular, the display unit 222 is formed on the position corresponding to the each touch sensor 62 and thus guides so that the user can operate a correct position in which the touch sensor 62 is located.

A second punching holes 222a may be further formed on the upper side of the plurality of display unit 222s. The second punching holes 222a are for displaying whether or not functions which appear on the display unit 222 are activated or selected and turning on and turning off of the second punching holes 222a or operations or a functions set by the turning on of the second punching holes 222a are capable of being easily confirmed.

The entire surface of the door 20 may maintain a flat surface by such a structure of the operating unit 22 and in particular the door 20 which is made of metal material may provide a concise and neat appearance.

Figure 3:
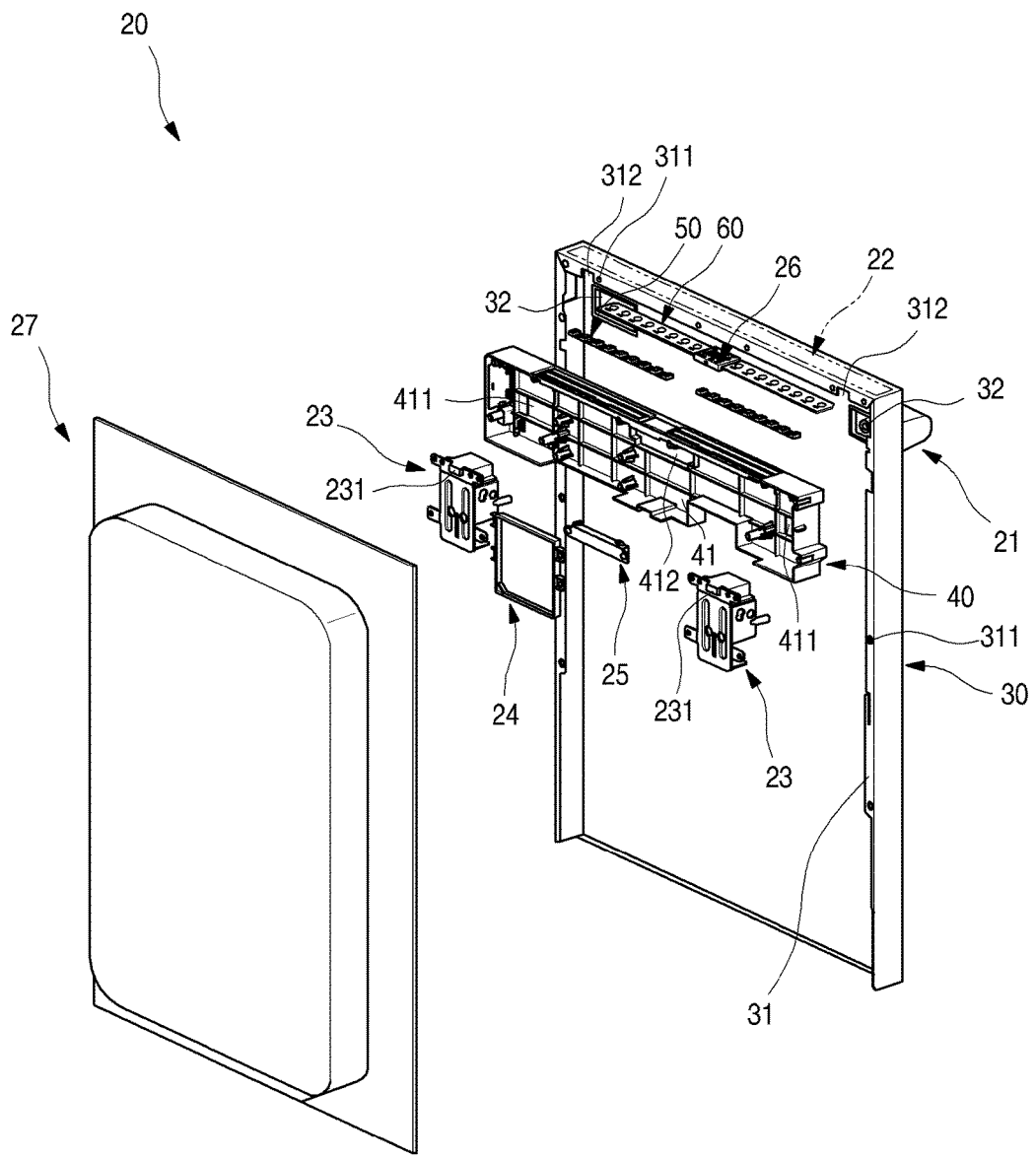
FIG. 3 is an exploded perspective view of a door of the dish washer.

FIG. 3 is an exploded perspective view of a door of the dish washer.

As illustrated in the drawing, the door 20 may be formed the appearance by the out plate 30 which forms the front surface and the peripheral surface and a back panel 27 which is coupled with the out plate 30 and forms a rear surface of the door 20.

The out plate 30 may be made of stainless material and may forms the peripheral surface, that is the upper surface and both right and left side surfaces, of the door may be formed by being bent many times. A bent portion 31 which is bent in the inside direction is formed in the end portion of the out plate 30. The bent portion 31 is formed so that configurations of the inside of the door 20 and the back panel 27 may be coupled with each other.

A plurality of screw holes 311 are opened in the bent portion and thus the back panel 27 and the mounting bracket 40 may be coupled. A rod hole 312 in which the push rod 231 is accessed is formed in the position, corresponding to the upper end of the door 20, in the bent portion 31.

The mounting bracket 40 is provided to the upper side of the inside of the door 20. The mounting bracket 40 is positioned on the upper end of the bent out plate 30 and has a corresponding size and a corresponding shape in order to be in close contact with the front surface and the peripheral surface of the out plate 30.

Specifically, the mounting bracket 40 may be injection molding with plastic material. The mounting bracket 40 may have a transverse width corresponding to the transverse width of the inside of the door 20. The mounting bracket 40 may have a thickness corresponding to the thickness of the inside of the door 20.

Accordingly, in a state where the mounting bracket 40 is mounted, the mounting bracket 40 is in a state of being in close contact with the front surface and the upper surface and the both right and the left side surfaces and supporting them. In addition, a space on which the tilting module 23 and the main controller 24, the front indicator 25 and the display 26 and the PCB assembly 60, provided in the inside of the door 20 is mounted is provided.

A base 41 which is in contact with the front surface of the door 20 and a edge 42 which is contact with the upper surface and the both side surfaces of the door 20 may be formed in the mounting bracket 40. Accordingly, a space in which the tilting module 23 and the main controller 24, the front indicator 25 may be disposed is formed in the inside space of the mounting bracket 40 formed by the edge 42.

Handle holes 32 are formed in the front surface of the out plate 30 corresponding to the both right and the left side ends and the both ends of the handle 21 by the handle holes 32 may be coupled with the tilting module 23 which is mounted in the inside of the door 20.

The tilting holes 411 are provided in the base 41 of the mounting bracket corresponding to the handle holes 32 and the tilting modules 23 are mounted on the position of the tilting holes 411. In other words, the tilting module 23 is fixed and mounted on the both sides of the mounting bracket 40 and the end portions of the handle 21 are passed through the handle holes 32 and the tilting hole 411s and thus may be coupled with the tilting modules 23 in the inside of the mounting bracket 40.

The push rods 231 which work with the tilting operation of the handle 21 are formed in the tilting modules 23 and when operating the tilting of the handle 21, the push rods 231 are projected by passing through the rear surface of the door 20 through the push road holes 312. The push rod 231 may more easily perform opening of the door 20 by pushing the cabinet 10.

An indicator hole 412 is formed in the center of the base 41 and a front indicator 25 is mounted on the mounting bracket 40 corresponding to the indicator hole 412. The indicator hole 412 communicates with a third through hole (not illustrated) having a fine size which is formed to pass through the out plate 30. At least one of third through hole is provided and light emitted from the front indicator 25 is transmitted through the third through hole and thus status display of the dish washer 1 on the front side of the door 20 is possible.

A main controller 24 for controlling an operation of the dish washer 1 may be mounted on the center portion of the mounting bracket 40.

The elastic member 50, the PCB assembly 60 and the display 26 are provided on the upper surface of the mounting bracket 40. The display 26 may be fixed and mounted on the position corresponding to the display unit 221 and may be supported by the mounting bracket 40. The elastic member 50 is mounted on the mounting bracket 40 and the PCB assembly 60 may be in close contact with the upper surface of the out plate 30, that is the rear surface of the operating unit 22 by the elastic member 50. Accordingly, the display 26 and the PCB assembly 60 may be close contact with the upper surface of the out plate 30, more specifically the rear surface of the operating unit 22 by the mounting bracket 40.

Figure 4:
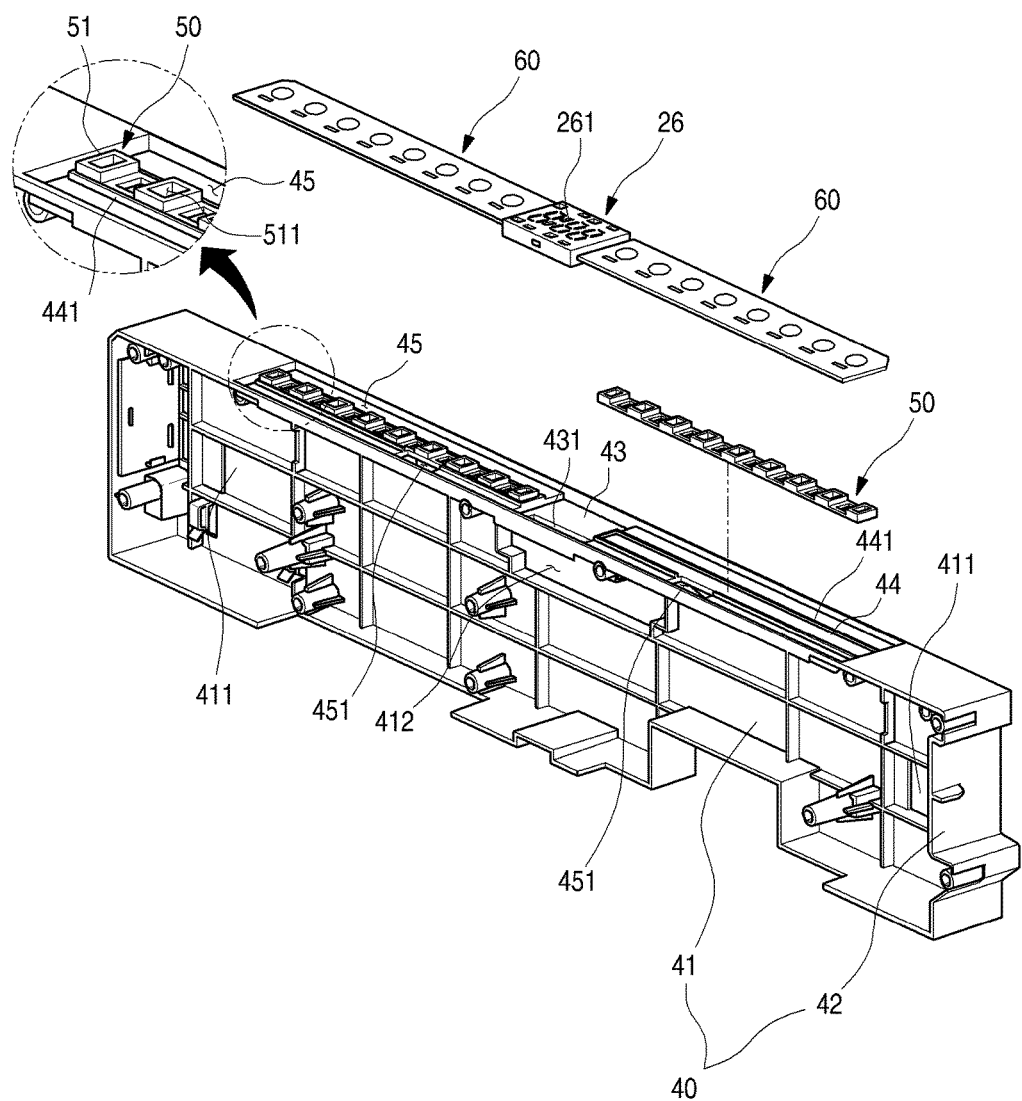
FIG. 4 is an exploded perspective view illustrating a coupling structure between a mounting bracket, an elastic member and a PCB assembly with each other according to the embodiment of the present invention.

FIG. 4 is an exploded perspective view illustrating a coupling structure between a mounting bracket, an elastic member and a PCB assembly with each other according to the embodiment of the present invention.

As illustrated in the drawing, the display mounting portion 43 depressed to the lower side is formed on the center of the upper surface of the mounting bracket 40. The display mounting portion 43 is formed in a shape corresponding to the display 26 and is depressed to the lower side. A first wire hole 431 is formed on the display mounting portion 43 and the wire connected with the display 26 through the first wire hole 431 may be directed to the main controller 24 through the mounting bracket 40.

A elastic member mounting portion 44 may be formed on the both right and left side surfaces mounted the display 26. The elastic member mounting portion 44 is formed in a shape corresponding to the elastic member 50 and is formed in order to accommodate the elastic member 50.

The elastic member mounting portion 44 may be defined by a mounting portion rib 441 which extends to the upper side. The height of the mounting portion rib 441 is formed to be less than the height of the elastic member 50 and thus it is prevented the mounting portion rib 441 from being in contact with the PCB assembly 60 and thus interfering in a compressive deformation process of the elastic member 50. In addition, the mounting portion rib 441 may prevent excessive deformation of the elastic member 50 and may prevent release of the elastic member 50.

A depression portion 45 which is generally depressed may be formed on the upper surface of the mounting bracket 40. The depression portion 45 may include the display mounting portion 43 and the elastic member mounting portion 44. In other words, the display mounting portion 43 and the elastic member mounting portion 44 may be positioned in the inside region of the depression portion 45.

The depression portion 45 may be formed to correspond to a disposition region of the PCB assembly 60. Accordingly, the PCB assembly 60 may be disposed on the inside region of the depression portion 45 in a state of the PCB assembly being mounted. A second wire holes 445 may be formed on a side of the depression portion 45. Accordingly, the wire which extends from the PCB assembly disposed on the upper side of the depression portion 45 passes through the second wire hole 451 and then may be connected with the main controller 24 disposed in the inside of the mounting bracket 40.

Meanwhile, the display 26 may include a plurality of LEDs 261 which may emits light to the first punching hole 221*a* and may include a configuration such as the seven-segment. The PCB assembly 60 on which the plurality of touch sensors 62 are mounted may be mounted on the both sides of the display 26.

In particular, the operating unit 22 is formed by continuous bending of the out plate 30 and generation of displacement of the out plate 30 is very low even if performing the touch operation since a width of the operating unit is comparatively narrow.

Accordingly, the PCB assembly 60 has a structure which is in close contact with the out plate 30 in order to effectively detect the touch operation of the operating unit 22. To this end, the PCB assembly 60 is attached to the out plate 30 using an adhesive sheet 65 and then is pressed and is fixed using a jig or a clamp. The PCB assembly 60 is pressed and supported by the mounting bracket 40 and the elastic member 50. Accordingly, the PCB assembly 60 may have a structure which is completely in close contact with the rear surface of the operating unit 22 and may detect fine displacement by the touch operation of the operating unit 22.

Figure 5:
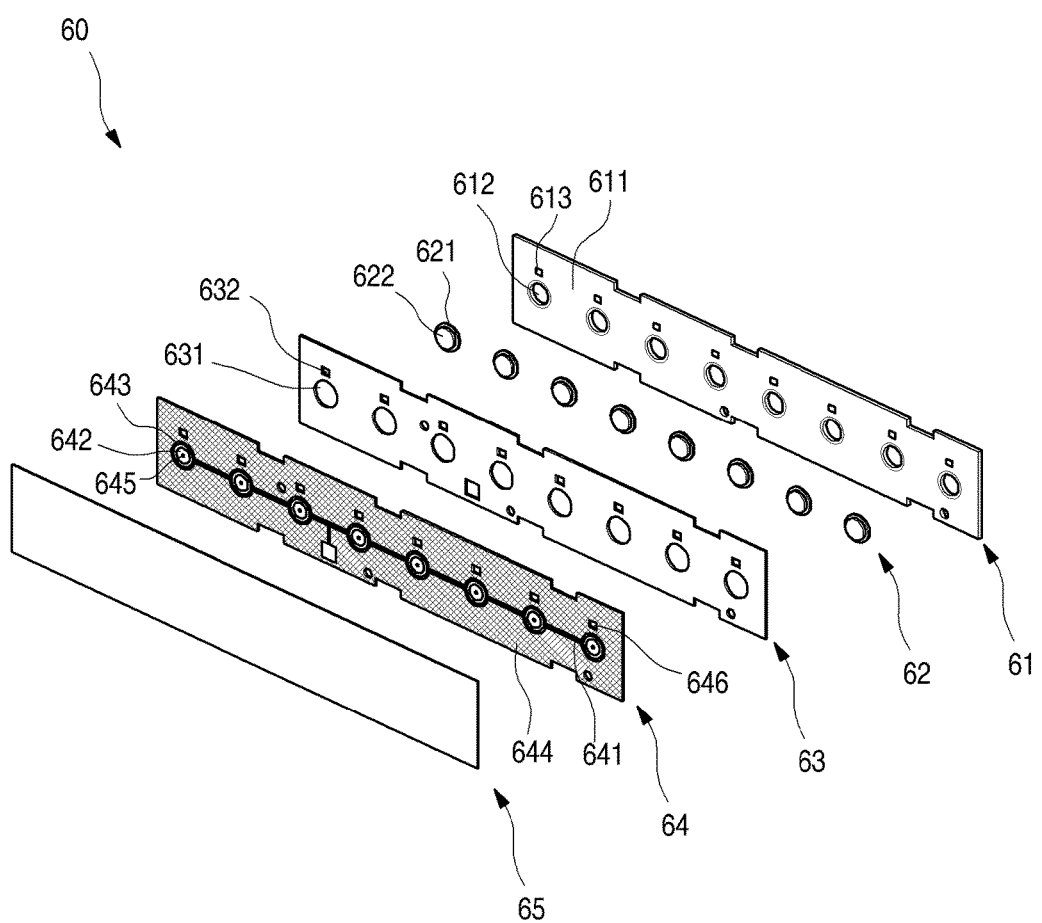
FIG. 5 is an exploded perspective view illustrating the PCB assembly according to the embodiment of the present invention.
Figure 6:
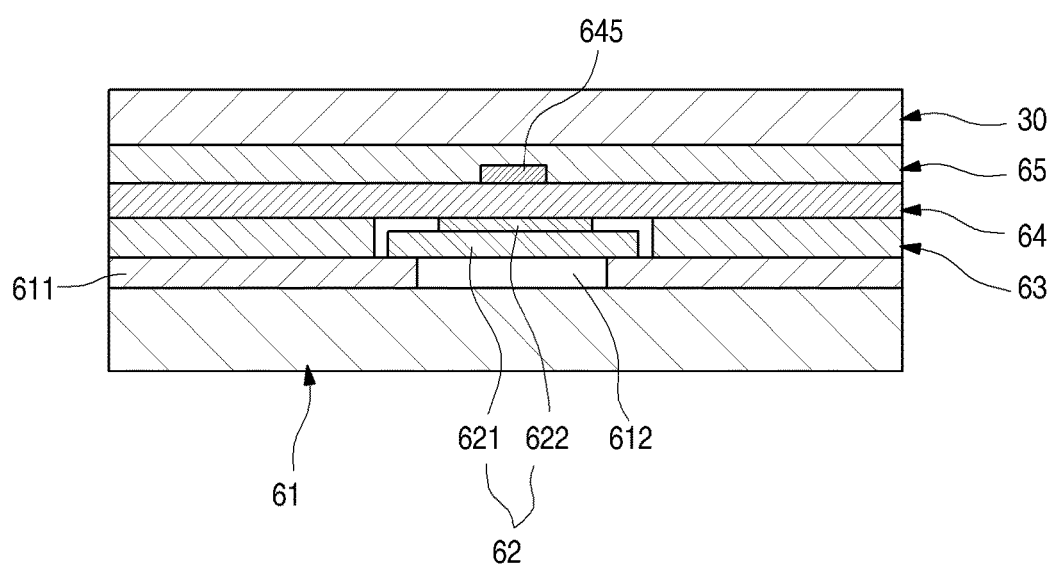
FIG. 6 is cross-sectional view illustrating a structure of the PCB assembly.

FIG. 5 is an exploded perspective view illustrating the PCB assembly according to the embodiment of the present invention. FIG. 6 is cross-sectional view illustrating a structure of the PCB assembly.

As illustrated in the Drawing, the PCB assembly 60 may include a sensor PCB 61 on which the touch sensor 62 is mounted a spacer 63 which is attached to the upper surface of the sensor PCB 61, a conductive foil 64 which is attached to the upper surface of the spacer 63 and an adhesive sheet 65 which is attached to the upper surface of the conductive foil 64.

Specifically, the sensor PCB 61 is made of plastic material and a copper coating 611 which constitutes a circuit is printed on a surface thereof. The touch sensor 62 which detects press displacement of the out plate by user touch is provided on the front surface of the sensor PCB 61.

The touch sensor 62 includes a piezoelectric sensor and more specifically a ceramic element 622 may be attached on the upper surface of the metal plate 621. The metal plate 621 may be elastically deformed according to a touch operating pressure of the out plate 30 of the user and the ceramic element 622 generates a change of amount of electricity according to this pressure. In the embodiment of the present invention, it is described that the shape of the touch sensor 62 has a circular shape, as an example. However, the shape of the touch sensor 62 is not limited to the circular shape and may be formed in various shapes.

Meanwhile, a plurality of touch sensors 62 may be formed along the sensor PCB 61 and a sensor hole 612 on which the touch sensor 62 is mounted is formed in the sensor PCB 61.

The sensor hole 612 may be formed on a position corresponding to a position on which the touch sensor 62 is mounted and may be formed by passing through the sensor PCB 61 or depressing the sensor PCB 61. The sensor hole 612 has a diameter which is less than the size of the touch sensor 62 and the periphery of the sensor hole 612 supports the periphery of the touch sensor 62, more correctly the periphery of the metal plate 621, from the lower side.

When displacement is generated to the out plate 30 when operating the touch operating unit 22 by such a structure, the displacement may transfer to the touch sensor 62, and at this time, since the metal plate 621 is supported on the periphery thereof, the touch sensor 62 may be more easily elastically deformed and the pressure generated when touching the touch operating unit 22 may be concentrated on the ceramic element 622 and thus the touch of the touch operating unit 22 is capable of effectively detecting when touching the touch operating unit 22.

The touch sensor 62 and the sensor hole 612 may be formed on the position corresponding to each display unit 222 formed on the operating portion 22 and the pressure may apply to the touch sensor 62 through the operation of the display unit 222 region.

A plurality of LEDs 613 may be mounted on the sensor PCBs 61. The LED 613 is formed on the position corresponding to the second punching hole 222a and the light is irradiated by passing through the second punching hole 222a.

A spacer 63 is attached on the upper surface of the sensor PCB 61. The spacer 63 is for defining a distance so that the sensor 61 and the conductive foil 64 may be bonded and may be configured as an adhesive member such as a double-sided tape. The spacer 63 is formed a size corresponding to the sizes the sensor PCB 61 and the conductive foil 64. The spacer 63 may be formed to have a predetermined thickness so that the conductive foil 64 may be in contact with a common contact with the upper surface of the touch sensor 62 and the sensor PCB at the proper height.

A spacer hole 631 is formed on a position corresponding to the position of the touch sensor 62 in the spacer 63. The touch sensor 62 may accommodate in the inside of the spacer hole 631 by spacer hole 631 having a size which is greater than the size of the touch sensor 62, and the spacer hole 631 is formed in order not to interfere with the touch sensor when elastically deforming the touch sensor 62.

A first LED hole 632 is further formed on the position corresponding to the LED 613 in the spacer 63. Accordingly, light emitted from the LED 613 is not interfered with the spacer 63 and directed to the second punching hole 222a.

A conductive foil 64 is bonded on the upper surface of the spacer 63. The conductive foil 64 may be made of resin film material such as PET and may have a size corresponding to the sensor PCB 61 and the spacer 63.

A conductor line 641 which may connect all the upper surface of the plurality of touch sensors 62 and the common contacts with each other is formed on the conductive foil 64. The conductor line 641 is printed with silver material on the lower surface of the conductive foil 64 and the printed surface of the conductor line 641 extends to be in contact with the spacer 63 and at the same time to be in contact with the touch sensors 62 and the common contacts.

Meanwhile, an inner guide line 642 and an outer guide line 643 which allow the touch sensor 62 to be attached on a correct position are printed in the conductive foil 64. The inner guide line 642 is formed to correspond to the size of the ceramic element 622 and the outer guide line 643 is formed to correspond to the size of the metal plate 621. Accordingly, the ceramic element 622 is positioned on the inner guide line 642 and the metal plate 621 is positioned on the outer guide line 643 in a state where the touch sensor 62 is mounted on the correct position.

A mesh 644 which includes grid-like lines may be further formed on the entire surface of the conductive foil 64 and noise may be reduced when generating a signal by the mesh 644.

A resistance to the deformation by the conductor line 641 when deforming the out plate is minimized since a mesh 644 is not formed between the outer guide line 643 and the inner guide line 642.

Meanwhile, a contacting portion 645 may be formed on the center of the inner guide line 642. The contacting portion 645 may be printed on the rear surface of the conductive foil 64. The contacting portion 645 is printed in a shape such as a circle shape or a point shape having a predetermined diameter and is capable of pressing the center of the ceramic element 622. Accordingly, the touch operation is more effectively recognized by the pressing force being capable of being concentrated toward the center of the touch sensor 62 when pressing the out plate 30.

A second LED hole 646 is further formed on the position corresponding to the LED 613 in the conductive foil 64. Accordingly, light emitted from the LED 613 is not interfered with the conductive foil 64 and directed to the second punching hole 222a.

A adhesive sheet 65 is provided on the upper surface of the side plate 64. The adhesive sheet 65 may be formed with material such as a double-sided tape and thus the entirety of the PCB assembly 60 including the conductive foil 64 is capable of being bonded on the rear surface of the out plate 30.

Figure 7:
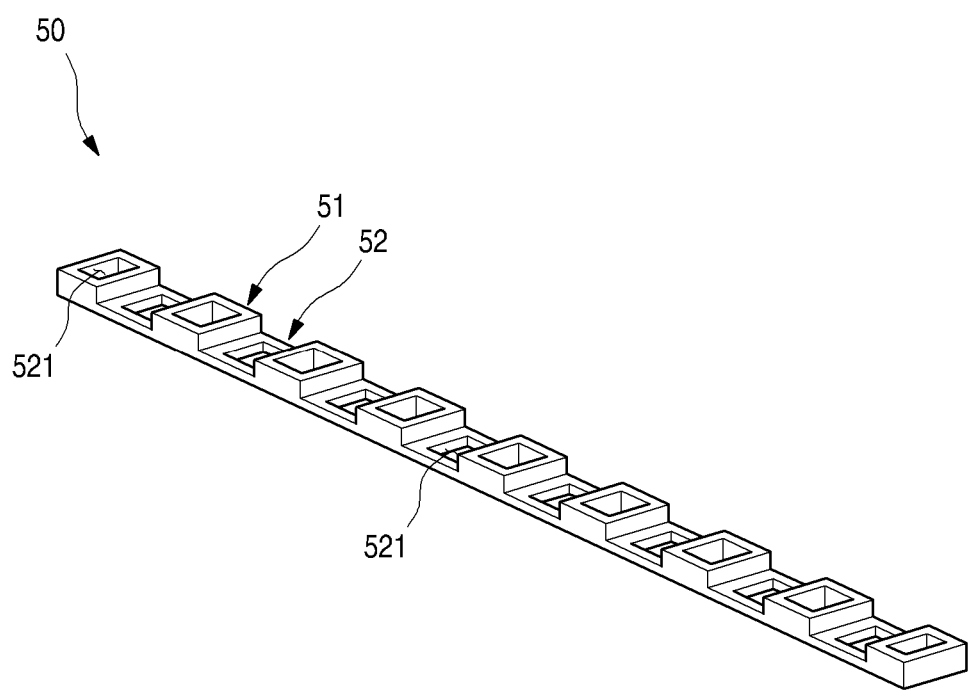
FIG. 7 is a perspective view of the elastic member.

FIG. 7 is a perspective view of the elastic member.

As illustrated in the drawing, the elastic member 50 may be made of rubber or synthetic resin material and material having elasticity. Accordingly, the elastic member 50 may be in contact with the rear surface of the PCB assembly 60 and then may be pressed to the side of operating unit 22 and be in close contact with the operating unit 22. In addition, the elastic member 50 may distribute the pressure which is transferred through the PCB assembly 60 when operating by touch by the elastic force of the structure itself.

Specifically, the elastic member 50 is generally formed in a shape such as a ladder and the support portion 51 and the connecting portion 52 are arranged to continuously repeat. Both the support portion 51 and the connecting portion 52 may be formed in a rectangular shape.

More specifically, the support portion 51 has an opening 511 having a rectangular shape on the center thereof and may be formed with a corresponding size to be capable of accommodating in the elastic member mounting portion 44. The support portion 51 is formed on the position which is greater than the position of the mounting portion rib 441 of the elastic member mounting portion 44.

The lower surface of the support portion 51 is in contact with the bottom surface of the elastic member mounting portion 44 and the upper surface of the support portion 51 pressurizes the PCB assembly by being in contact with the lower surface of the PCB assembly 60. Accordingly, the support portion 51 becomes a compressed state and allows the PCB assembly 60 to be in close contact with the out plate 30.

At this end, the height of the support portion 51 may be formed to be greater than the distance between the elastic member mounting portion 44 and the PCB assembly 60 in a state where the mounting bracket 40 and the PCB assembly 60 is mounted on the inside of the door 20. In other words, a state where the elastic member 50 is compressed or a contact state immediately before compressing is maintained in a state where all the mounting bracket 40, the PCB assembly 60 and the elastic member 50.

The support portion 51 is positioned between the plurality of touch sensors 62 mounted on the sensor PCB 61. In other words, the deformation is concentrated on the side of the touch sensor 62 when touching the operating unit 22 by the touch sensor 62 may be disposed between the neighboring support portions 51.

a connecting portion 52 is formed between the support portions 51. The connecting portion 52 is for connecting the neighboring support portions 51 and has a rectangular shape and an opening 521 is formed on the center thereof. The connecting portion 52 is provided on the lower side corresponding to the sensor PCB 61 and may be formed by the same number as the number of the sensor PCB 61.

Accordingly, the connecting portion 52 may be formed on a position which is less than the height of the support portion 51 and the mounting portion rib 441 since it is sufficient if the connecting portion 52 has a structure which can connect the supporting structures 51. The connecting portion 52 has the same width as the width of the support portion 51 and thus the connecting portion 52 may be mounted on the inside of the elastic member mounting portion 44.

The connecting portion 52 has a function connecting between the support portions 51 and at the same time has a function which facilitates the elastic deformation of the support portions 51 in the lateral direction and thus load applied to the support portion 51 may be distributed.

Figure 8:
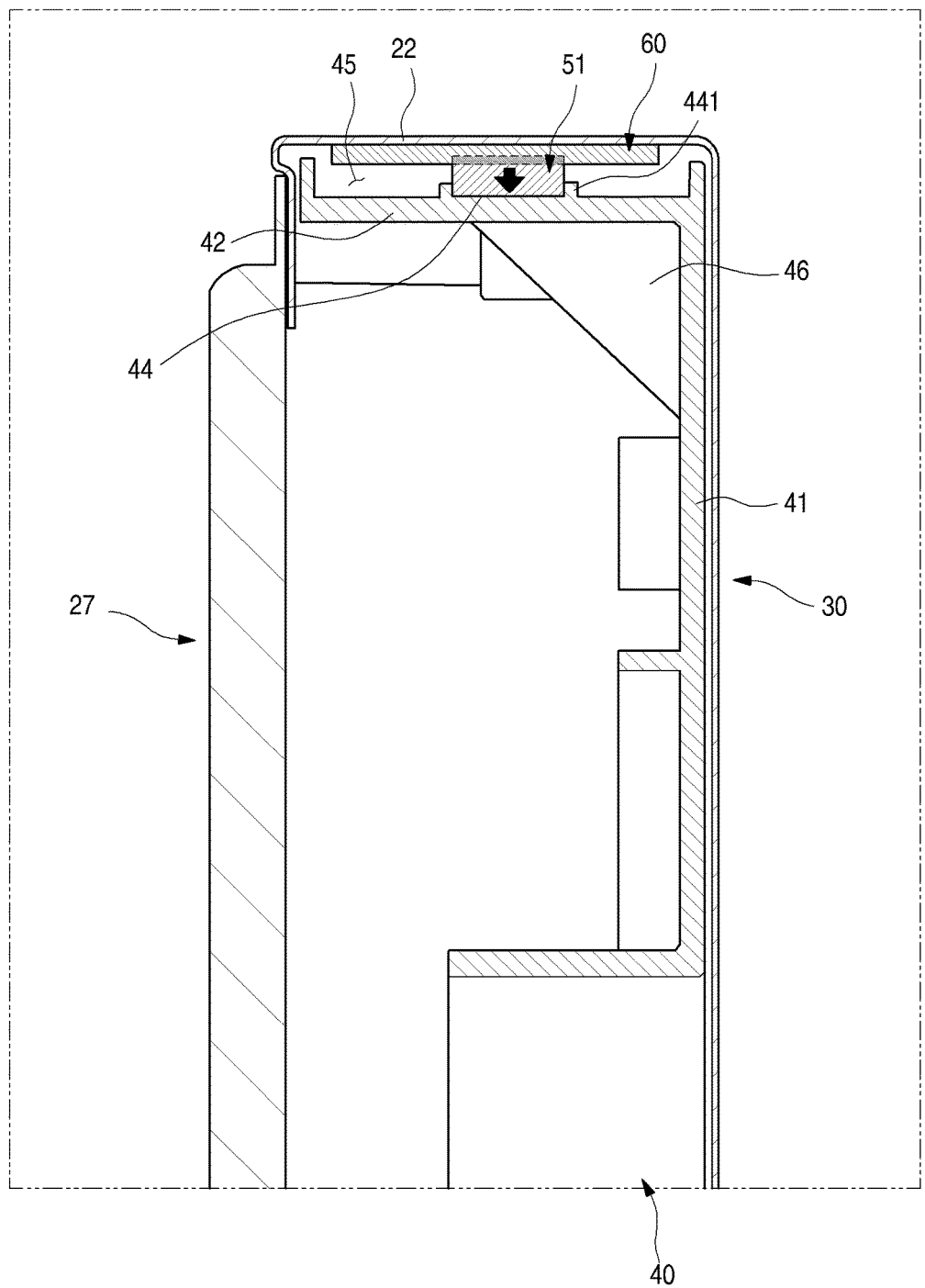
FIG. 8 is a sectional view taking along line 8-8' in FIG. 1.

FIG. 8 is a sectional view taking along line 8-8' in FIG. 1.

As illustrated in the drawing, the mounting bracket 40 is mounted on the upper portion of the inside of the door 20 and the mounting bracket 40 is in close contact with the inside surface of the out plate 30. The elastic member 50 supports the PCB assembly 60 from the lower side in a state of being accommodated in the inside of the elastic member mounting portion 44.

The PCB assembly 60 is bonded and fixed to the rear surface of the operating portion 22 while being pressurized and supported by the elastic member 50. At this time, the elastic member 50 becomes a state where the support portion 51 supports the lower surface of the PCB assembly 60 and thus becomes a state where a compressive force is applied even before touch operation.

In other words, the elastic member 50 has a height which is greater than the distance between the upper surface of the mounting bracket 40 and the rear surface of the PCB assembly 60. Accordingly, when assembling the mounting bracket 40 and the elastic member 50 and the PCB assembly 60, the elastic member 50 becomes a state where the compressive force is always applied and thus the PCB assembly 60 is in close contact with the rear surface of the operating unit 22.

Meanwhile, a reinforcing rib 46 may be further formed on an edge which forms the upper surface and the front surface of the mounting bracket 40. The reinforcing rib 40 connects the lower surface on which the elastic member mounting portion 44 is formed and the front surface of the inside of the mounting bracket 40. Accordingly, the mounting bracket 40 is supported in order not to be deformed or be damaged even if the user presses the operating unit 22 with an excessive force.

Hereinafter, a touch operation of the dish washer having the structure as described above will be described.

Figure 9A:
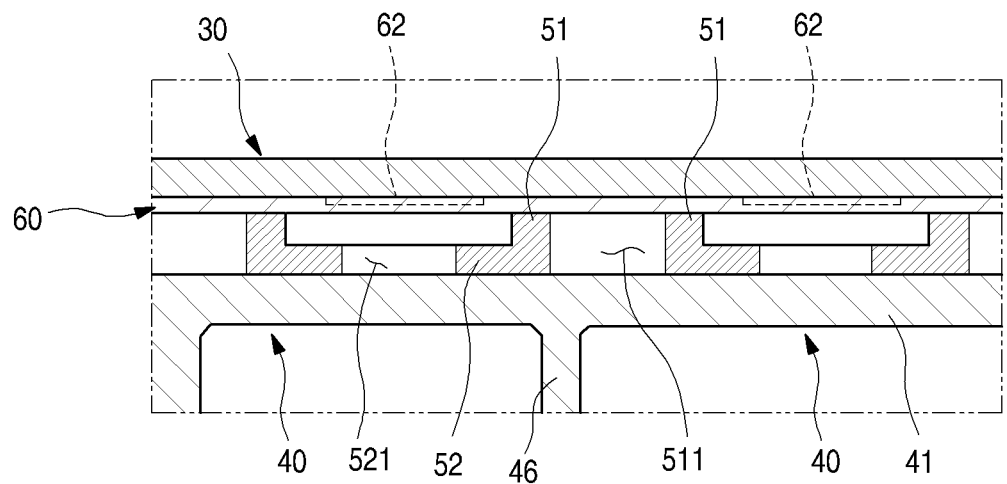
FIG. 9a and FIG. 9b are schematic views illustrating a state change of the elastic member when operating the operating unit by touch.
Figure 9B:
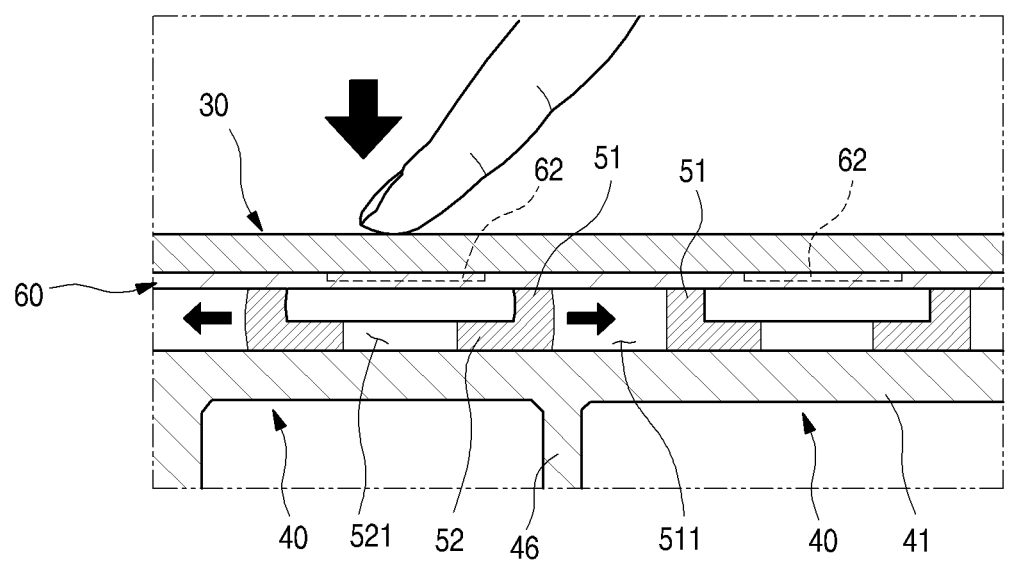

FIG. 9*a* and FIG. 9*b* are schematic views illustrated a state change of the elastic member when operating the operating unit by touch.

A user may operate the operating unit 22 in order to operate a driving of the dish washer 1.

The displacement of the out plate 30 is not generated before operation of the operating portion 22 as illustrated in FIG. 9*a*. Accordingly, signal is no longer detected at the touch sensor 62. The PCB assembly 60 is capable of maintaining a state of being always in close contact with the rear surface of the operating portion 22 since the elastic member 50 is in a state of being compressed.

The user can confirm the operating state through light displayed on the second punching hole 222*a* of the operating portion 22 or the display unit 221 of the dish washer and then operates by pressing the display unit 222 region of the operating unit 22 for a desired operation.

As in FIG. 9*b*, when the user touches a display unit region of the operating unit 22, fine displacement is generated in the out plate 30. The touch sensor 62 recognizes the touch operation in response to the displacement of the out plate 30.

At this time, the support portion 51 may be further compressed by the pressing force by the user and the support portion 51 is freely deformed in the lateral direction due to the nature of its shape. Accordingly, even if the user presses the support portion 51 with an excessive force, load may be distributed by the deformation of the support portion. Damage or deformation of the elastic member mounting portion 44 or the mounting bracket 40 may be detected by the distribution of the load.

In addition, in a case where the user press between the display unit 222 and a region which is not the display unit 222 or an adjacent position to the display unit 222, a position which is pressed by the neighboring support portion 51 is capable of supporting and the load is capable of being distributed by the support portion 51. Therefore, it is prevented misrecognition of the touch sensor 62.

Naturally, the PCB assembly 60 maintains the state of being in close contact with the out plate by the compressive force which is basically provided despite the deformation of the support portion 51. When the touch operation is terminated, the support portion 51 returns to an original shape thereof by the elastic restoring force.

What is claimed is:

1. A dish washer, comprising;
    a cabinet forming a dish washing space in the inside thereof; and
    a door opening and closing a front surface of the cabinet;
    wherein the door includes:
        a metal out plate forming the front surface of the door and at least a portion of a peripheral surface of the door,
        wherein the peripheral surface of the door is formed by bending the metal out plate;
        an operating unit formed on the peripheral surface of the door;
        a PCB assembly, contacting a rear surface of the operating unit, on which a plurality of touch sensors detecting displacement of the operating unit are mounted,
        a mounting bracket mounted to an inside surface of the metal out plate;
        an elastic member, mounted on the mounting bracket, pressing and supporting the PCB assembly to the rear surface of the operating unit;
        a handle, provided on the front surface of the door, facilitating a turning operation of the door; and
        a tilting module including a push rod is provided on the mounting bracket, the push rod being selectively projected to the rear surface of the door and pushing the cabinet to open the door,
        wherein both ends of the handle are mounted on the tilting module by passing through the metal out plate and the mounting bracket to work with the push rod.

2. The dish washer of claim 1, wherein the operating unit is formed on an upper peripheral surface of the door.

3. The dish washer of claim 1, further comprising:
a display unit displaying operating information and being disposed on a surface of the operating unit corresponding to a position of each of the plurality of touch sensors.

4. The dish washer of claim 1, wherein the mounting bracket is in contact with the front surface and the peripheral surface of the door.

5. The dish washer of claim 4, further comprising:
a bending portion, bent towards the inside direction of the door, on the peripheral surface, and
a screw hole which is formed so that a screw is passed through the bending portion,
wherein the screw is fastened to the mounting bracket and the bending portion and thus allows the mounting bracket to be fixed.

6. The dish washer of claim 1, wherein an elastic member mounting portion, formed on the mounting bracket, is formed in a shape corresponding to the elastic member and accommodates the elastic member.

7. The dish washer of claim 6, wherein the elastic member mounting portion is formed by a mounting portion rib having a height which is less than the height of the elastic member.

8. The dish washer of claim 6, wherein a reinforcing rib which supports the elastic member mounting portion from a lower side by extending to another surface of the mounting bracket which is in contact with a lower surface of the elastic member mounting portion is formed on the lower surface of the elastic member mounting portion.

9. The dish washer of claim 8, wherein a plurality of reinforcing ribs are formed along the elastic member mounting portion and are disposed parallel to each other with a fixed distance there between.

10. The dish washer of claim 1, wherein a height of the elastic member is formed to be greater than a distance between a bottom surface of the elastic member mounting portion and the PCB assembly and the elastic member is maintained in a compressed condition to apply the elasticity of the elastic member toward the PCB assembly.

11. The dish washer of claim 1, wherein the elastic member includes:
a rectangular shape of a support portion which is opened at the center thereof and which is protruded to a lower side corresponding to a region between the touch sensors, and
a connecting portion which connects between a plurality of support portions.

12. The dish washer of claim 11, wherein a center of the connecting portion is formed to be opened.

13. The dish washer of claim 11, wherein the connecting portion is formed to be less than the height of the support portion.

14. The dish washer of claim 1, wherein a display mounting portion, accommodating a display for displaying operating information of the dish washer, is formed in the mounting bracket, and
wherein a display unit which includes a plurality of first fine through-holes through which light emitted from the display is selectively transmitted is formed in the metal out plate corresponding to the display.

15. The dish washer of claim 14, wherein a depression portion is formed on the upper surface of the mounting bracket and accommodates the PCB assembly.

16. The dish washer of claim 15, wherein the depression portion includes
the display mounting portion, and
an elastic member mounting portion which accommodate the elastic member is disposed on both sides of the display mounting portion.

17. The dish washer of claim 1, wherein an indicator hole, in which a front indicator displaying an operation of the dish washer is mounted, is formed on the mounting bracket, and
wherein a through-hole through which light of the front indicator is transmitted is formed on the front surface of the door corresponding to the indicator hole.

18. The dish washer of claim 1, wherein an LED is disposed on a side of each touch sensor in the PCB assembly, and
wherein a second through-hole is formed at a position corresponding to the LED in the operating unit,
such that light from the LED is transmitted through the second through-hole.

19. The dish washer of claim 1, wherein a bent portion, bent towards the inside direction of the metal out plate is formed in the end portion thereof, and
a push rod hole is formed on the bent portion corresponding to the upper end of the door and the push rod is projected by passing through the push rod holes when operating of the handle.

20. The dish washer of claim 1, wherein the PCB assembly includes:
a sensor PCB supporting a periphery of the touch sensor;
a conductive foil, provided on the front side of the sensor PCB, connecting common contacts between the touch sensor and the sensor PCB with each other; and
a spacer bonding the conductive foil and the sensor PCB while maintaining a fixed distance therebetween,
wherein a contacting portion, projected to be in contact with the touch sensor, is formed in the conductive foil.

* * * * *